United States Patent
Watanabe et al.

(10) Patent No.: US 7,012,191 B1
(45) Date of Patent: Mar. 14, 2006

(54) LEAD WIRE SEALING DEVICE, RECORDING DISK DRIVE, AND METHOD FOR SEALING HOUSING MEMBER

(75) Inventors: Nobuaki Watanabe, Kyoto (JP); Tokichi Ito, Kyoto (JP)

(73) Assignee: Nidec Corporation, Kyoto (JP)

( * ) Notice: Subject to any disclaimer, the term of this patent is extended or adjusted under 35 U.S.C. 154(b) by 0 days.

(21) Appl. No.: 11/120,199

(22) Filed: May 3, 2005

(30) Foreign Application Priority Data

Dec. 28, 2004 (JP) .............................. 2004-379330

(51) Int. Cl.
*H05K 5/00* (2006.01)
(52) U.S. Cl. ...................... 174/50; 174/52.1; 174/52.5; 361/714
(58) Field of Classification Search ................. 174/50, 174/52.1, 52.5; 361/827, 826, 714, 724; 220/4.02; 248/906; 439/535
See application file for complete search history.

(56) References Cited

U.S. PATENT DOCUMENTS

| | | | |
|---|---|---|---|
| 4,985,793 A | 1/1991 | Anderson | |
| 6,137,203 A * | 10/2000 | Jermakian et al. | 310/191 |
| 6,737,577 B1 * | 5/2004 | Liao et al. | 174/50 |
| 6,878,875 B1 * | 4/2005 | Aronson et al. | 174/50 |
| 6,911,598 B1 * | 6/2005 | Onizuka et al. | 174/50 |

FOREIGN PATENT DOCUMENTS

| | | |
|---|---|---|
| JP | 2661758 | 6/1997 |
| JP | 3373262 | 11/2002 |
| JP | 3373625 | 11/2002 |

* cited by examiner

*Primary Examiner*—Dhiru R. Patel
(74) *Attorney, Agent, or Firm*—Westerman, Hattori, Daniels & Adrian, LLP (57) ABSTRACT

According to a lead wire sealing device of an example of the present invention, a bush 116 is inserted in a housing through hole 113 formed in a bottom plate member 1110 and a lead wire 1343 is inserted in the inside of the bush 116. A first adhesive 117 is loaded in the inside of the bush 116, the first space S1, the second space S2 and the third space S3. A second adhesive 118 covers the first adhesive 117 at the edge where a flange portion 1162 of the bush 116 is provided. The first adhesive 117 having a lower viscosity is easily inserted in the first space S1 by a capillary action to be loaded without a space. As a result, it is possible to certainly seal the first space S1.

23 Claims, 6 Drawing Sheets

LEAD WIRE SEALING DEVICE, RECORDING DISK DRIVE, AND METHOD FOR SEALING HOUSING MEMBER

BACKGROUND OF THE INVENTION

1. Field of the Invention

The present invention relates to a lead wire sealing device, and a method for sealing a housing through hole formed on a housing member.

2. Description of the Prior Art

Conventionally, in a recording disk drive such as a hard disk drive or the like, a through hole is formed on a bracket of a spindle motor and/or a housing of the recording disk drive to connect a lead wire as a part of windings of the spindle motor or the like to a printed circuit board provided in the outside of the housing or the like.

For example, forming a bracket through hole having a lead wire of the windings inserted therein on the bracket of a spindle motor, a through hole is formed on a flexible printed circuit board (hereinafter, referred to as an FPC) and the FPC through hole is located just under the bracket through hole. Further, the size of the FPC through hole is made smaller than that of the bracket through hole and whereby the FPC through hole is fit inside of the bracket through hole and when the lead wire of the windings is pulled out via the bracket through hole and the FPC through hole, the lead wire has little risk to contact directly the inner edge of the bracket through hole. The technology that the lead wire is prevented from contacting the bracket in this way omits a contact protection component such as a rubber tube or the like.

On the other hand, in the hard disk drive, the lead wire of the windings is also pulled out from a mechanism other than the spindle motor to be connected to the printed circuit board outside of the housing and the outside power source or the like. As a mechanism from which the lead wire is pulled out, a latch coil for releasing fastening of an actuator arm in a latch (fastening) mechanism of the actuator arm to which a transducer for writing the information is disclosed.

In the meantime, in the hard disk drive, by sealing the closed space of the housing having a recording disk housed therein as separated from the outside, an air around the recording disk is kept clean. Then, in order to prevent air leak to the closed space and maintain a sealed condition, the through hole for pulling out the lead wire formed on the housing is sealed by a sealing material.

On the other hand, in late years, the hard disk drive unit is also utilized in a car navigation system and high decay durability is required from a car-mounted hard disk drive. For example, in a heating and humidification test, an endurance test of 1,500 hours under temperature 90° C. and humidity 95% is done. In addition, in a heat shock test, an endurance test to repeat cooling and heating for each fifteen minutes under temperatures (−40)° C. and 85° C. alternately 1,500 times is done.

When sealing the through hole for pulling out the lead wire of the windings by one kind of adhesive, under such a severe test condition, the adhesive may have cracks or the adhesive may be separated from the housing. As a result, a gas may enter the closed space of the housing to be kept clean from outside. For example, there is a method of inserting a tubular bush made of an insulation material in the through hole and sealing the through hole after inserting the lead wire in the bush. However, such a method has a possibility that a space is left between the outer circumferential surface of the bush and the inner circumferential surface of the through hole when loading the adhesive and under the above-described high temperature, the gas in the space expands to cause cracks on the adhesive. In addition, due to a difference of a thermal expansion between the housing and the bush, a distance between the outer circumferential surface of the bush and the inner circumferential surface of the through hole may be changed upon heating and cooling and the adhesive may not follow change of the distance to be separated form the housing or the bush.

SUMMARY OF THE INVENTION

The present invention has been made taking the foregoing problems into consideration and an object of the present invention is to certainly seal a space between an outer circumferential surface of a bush and an inner circumferential surface of a through hole of a housing.

The other object of the present invention is to provide a lead wire sealing device having excellent reliability and durability, and a recording disk drive.

A lead wire sealing device according to an example of the present invention may comprise a housing member that is a part of a housing which forms a closed space therein, the housing member having an upper surface facing the closed space of the housing and an lower surface facing an open space, an electric component that is mounted on the upper surface of the housing member, and a lead wire of the electric component to an electrode formed on the lower surface of the housing member.

A housing through hole, which penetrates from the closed space to the open space and has the lead wire inserted therein, is formed in the housing member. A bush, which covers an inner circumferential surface of the housing through hole and has the lead wire inserted in the inside thereof, is inserted in the housing through hole.

Then, a first adhesive that is filled into a continuous space including not only a first space which is formed between an outer circumferential surface of the bush and the inner circumferential surface of the housing through hole but a second space which seals the housing through hole, as a manner that the first adhesive has no isolated air bubble therein.

In addition, a second adhesive having a higher viscosity than that of the first adhesive when they are not hardened, the second adhesive covering an upper space of the first space filled with the first adhesive to isolate the first adhesive from an inner air.

A recording disk drive according to an example of the present invention may comprise a housing which forms a closed space therein, the housing having an upper surface which is formed into the closed space and an lower surface which is formed an open space, an electric component that is mounted on an upper surface of the housing in the closed space, an electric motor including a stator that is held at the housing, a rotor magnet fixed to a rotation part to be opposed to the stator in radial direction, and a lead wire connecting from the electric component to an electrode formed on an lower surface of the housing.

A housing through hole, which penetrates from the closed space to the open space and has the lead wire inserted therein, is formed in the housing. A bush, which covers the inner circumferential surface of the housing through hole and has the lead wire inserted in the inside thereof, is inserted in the housing through hole.

Then, a first adhesive that is filled into a continuous space including not only a first space which is formed between an outer circumferential surface of the bush and the inner circumferential surface of the housing through hole but a second space which seals the housing through hole, as a manner that the first adhesive has no isolated air bubble therein.

In addition, a second adhesive having a higher viscosity than that of the first adhesive when they are not hardened, the second adhesive covering an upper space of the first space filled with the first adhesive to isolate the first adhesive from an inner air.

A method of sealing a housing member according to an example of the present invention, the method of sealing the housing member that is a part of a housing which forms a closed space therein and includes an electric component housed therein, a lead wire connecting from the electric component to an electrode formed on an lower surface of the housing member in a open space, a bush having a bush through hole, and a housing through hole that is formed in the housing member; the method may comprise the steps of: inserting the bush into the housing through hole for covering an inner circumferential surface of the housing through hole; inserting the lead wire into the bush through hole and the housing through hole from an upper side of the bush; and connecting the lead wire fixedly on the electrode for making an electrical connection.

In addition, the above-described method of sealing a housing through hole may comprise a step of loading a first adhesive for filling into a continuous space including not only a first space which is formed between an outer circumferential surface of the bush and an inner circumferential surface of the housing through hole but a second space which seals the housing through hole, as a manner that the first adhesive has no isolated air bubble therein; and loading a second adhesive for covering an upper space of the first space filled with the first adhesive to isolate the first adhesive from an inner air, wherein the second adhesive has a higher viscosity than that of the first adhesive when they are not hardened.

According to an example of the present invention, it is possible to certainly seal the first space between the outer circumferential surface of the bush and the inner circumferential surface of the through hole of the housing. Particularly, due to optical setting property, it is possible to easily harden a part capable of lighting the first adhesive and enhance hardening of an inner part that is difficult to light by covering the first adhesive with the second adhesive.

DESCRIPTION OF THE PREFERRED EMBODIMENTS

With reference to the drawings, an embodiment of the present invention will be described below. In the meantime, when explaining positional relations and directions of respective members vertically and horizontally in the following description, the positional relations and directions on the drawing are merely described differently from the positional relations and directions when respective members are incorporated in a real apparatus.

A First Embodiment

<A Recording Disk Drive>

Figure 1:
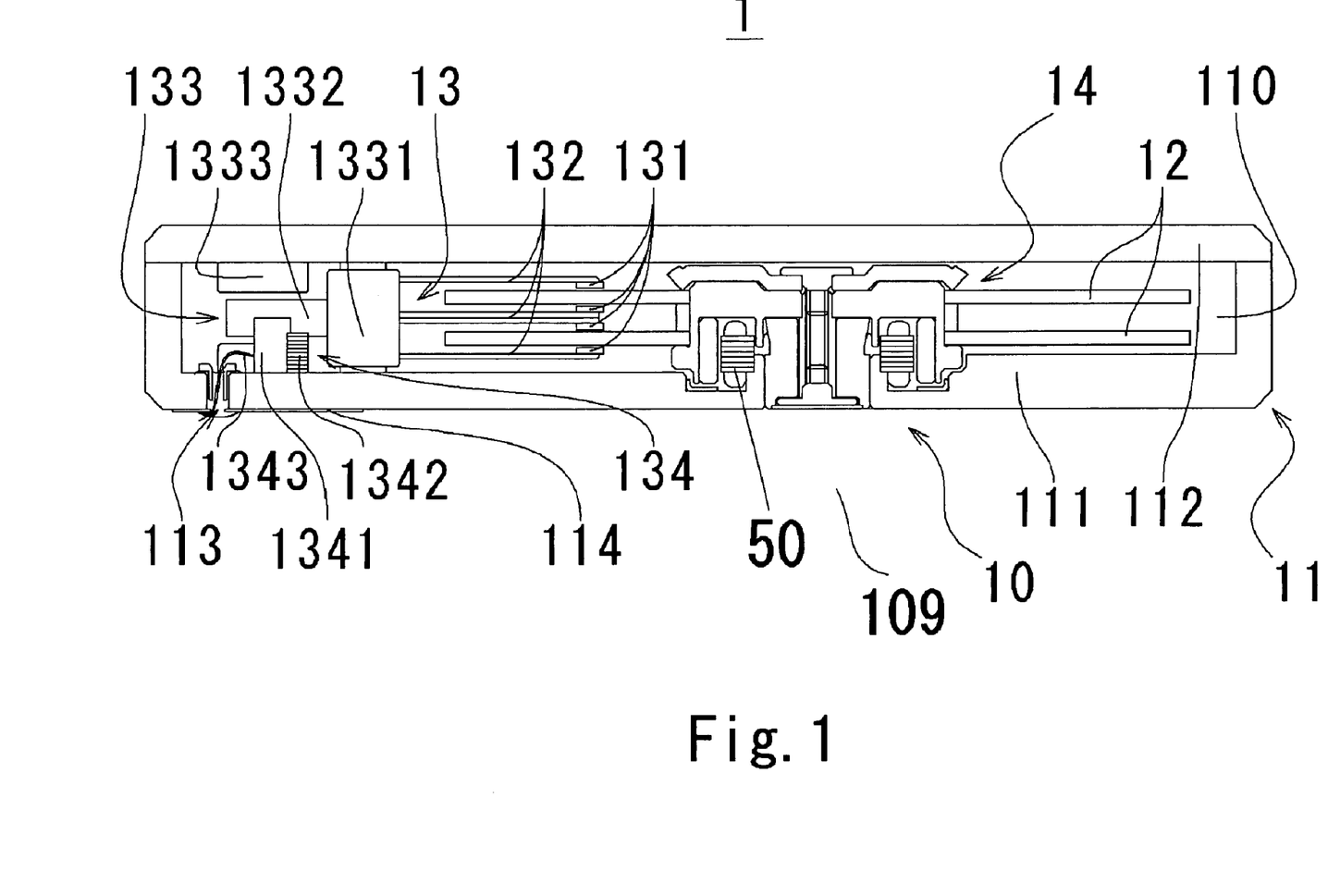
FIG. 1 is a sectional view for showing an inner device of a recording disk drive.

FIG. 1 is a sectional view for showing an inner configuration of a recording disk drive 1 according to an embodiment of the present invention. According to the present embodiment, the recording disk drive 1 is a hard disk drive of a car navigation system that is mounted on a car. The recording disk drive 1 is provided with a recording disk 12 of a disk type for recording the information, an access unit 13 for reading and (or) writing the information about the recording disk 12, an electric motor 14 rotating as holding the recording disk 12, and a housing 11 for housing the recording disk 12, the access unit 13, and the motor 14 in an closed space 110 and separating them from the outside.

The housing 11 is provided with a first housing member 111 of a platy type to which the motor 14 and the access unit 13 are attached and a second housing member 112 of a cap type for forming the closed space 110 by covering the motor 14 of the first housing member 111 and the access unit 13. In the recording disk drive 1, under a depressurized condition, the first housing member 111 is joined with the second housing member 112 to make the closed space 110 into a clean space having remarkably less dust.

The access unit 13 is provided with a magnetic head 131 for reading and writing the information as closing to the recording disk 12, an arm 132 for supporting the magnetic head 131, a head moving mechanism 133 for changing a relative position of the magnetic head 131 and the recording disk 12 by moving the arm 132, and a latch mechanism 134 for fastening the arm 132 when the recording disk drive 1 stops and holding it at a certain position. Due to these configurations, the magnetic head 131 accesses a certain position of the recording disk 12 as closing to the rotating recording disk 12 to read and write the information.

The head moving mechanism 133 is provided with an arm base 1331 holding a plurality of arms 132 integrally, a voice coil 1332 located at the arm base 1331, and a magnet 1333 for generating a force to rotate the arm 132 between the magnet 1333 and the voice coil 1332. The latch mechanism 134 is provided with a fastening member 1341 for fastening the arm 132 through the arm base 1331 and a latch coil 1342 for releasing fastening of the arm 132 due to the fastening member 1341. In the latch mechanism 134, by flowing electric current to the latch coil 1342, a force to move the latch coil 1342 in a direction away from the magnet 1333 is generated and due to this force, the fastening member 1341 is moved in a direction away from the arm base 1331 to release fastening of the arm 132.

<Configuration of the First Housing Member 111 and a Housing Through Hole 113>

As shown in FIG. 1, the first housing member 111 is provided with the housing through hole 113 of a substantially cylindrical column having a lead wire 1343 from the latch coil 1342 inserted therein is provided. In the meantime, the latch coil 1342 and the lead wire 1343 are made of the same member and the vicinity of the member to be pulled from the housing through hole 113 to the open space 109 in the latch coil 1342 is described as "lead wire 1413".

The lead wire 1343 extended from the closed space 110 of the sealed housing 11 to an open space 109 is connected to an electrode of a FPC 114 provided on a lower surface of the first housing member 111. In the recording disk drive 1, the motor 14 and the first housing member 111 on which the motor 14 is attached and the housing through hole 113 is formed are treated as a semifinished motor unit 10. In the meantime, in a real recording disk drive 1, the through hole for pulling out respective lead wires of a stator 50 of the motor 14 and the voice coil 1332 of the head moving mechanism 133 or the like to the outside of the housing are also formed in the housing 11 (illustration is herein omitted in FIG. 1).

Figure 2:
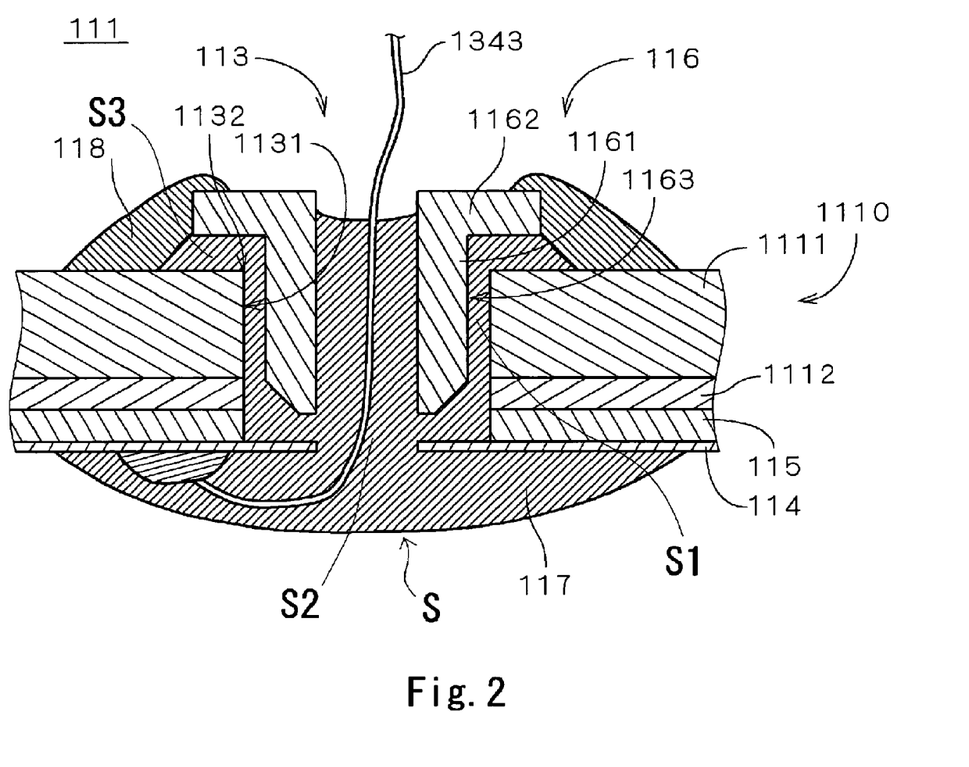
FIG. 2 is a sectional view enlarging a vicinity of a housing through hole.

FIG. 2 is a sectional view enlarging a vicinity of the housing through hole 113 of the first housing member 111. In FIG. 2, a distance between a bottom plate member 1110 and a bush 116 to be described later is illustrated to be larger than a real distance. As shown in FIG. 2, the bottom plate member 1110, which is a main part of the first housing member 111 and serves as a bottom plate of the housing 11 is provided with a bottom plate part 1111 to be made of aluminum (Al) or aluminum alloy and a coating layer 1112 made of resin formed on the lower surface of the bottom plate part 1111 by electrodeposition coating. The housing through hole 113 is formed so as to penetrate through the bottom plate part 1111 and the coating layer 1112. An FPC 114 is mounted on the lower surface of the coating layer 1112 via an adhesive 115 that is applied thereon without located on the housing through hole 113, and on a portion of the FPC 114 corresponding to the housing through hole 113, a FPC opening of a substantially circle in which the lead wire 1343 is inserted is formed. A diameter of the FPC opening is made smaller than that of a housing opening of the housing through hole 113 and it is substantially equal to an inner diameter of the bush 116 to be described later.

The first housing member 111 is further provided with the bush 116 made of resin of a substantially tubular form to be inserted in the housing through hole 113 and the bush 116 is bonded with the bottom plate member 1110 with two kinds of adhesives (hereinafter, "a first adhesive 117" and "a second adhesive 118"). The bush 116 is provided with a cylindrical part 1161 having a smaller outer diameter than an inner diameter of the housing through hole 113 and a flange portion 1162 of a ring shape to be provided on the upper part of the cylindrical part 1161. The cylindrical part 1161 is inserted in the housing through hole 113 to cover an inner surface 1131 of the housing through hole 113. The flange portion 1162 is expanded from an outer surface 1163 of the cylindrical part 1161 outward at the upper side of the housing through hole 113 to cover an edge 1132 of the housing through hole 113.

In the real recording disk drive 1, the lead wire 1343 is pulled out from the closed space 110 (refer to FIG. 1) of the housing 11 through the inside of the bush 116 to the open space 109 to be bonded with the electrode of the FPC 114 by soldering. Since the edge 1132 of the housing through hole 113 is covered with the flange portion 1162 of the bush 116, disconnection of the lead wire 1343 due to contact of the lead wire 1343 and the edge 1132 is prevented. In addition, since the inner circumferential surface 1131 of the housing through hole 113 is covered with the cylindrical part 1161 of the bush 116, contact of the lead wire 1343 and the inner circumferential surface 1131 of the housing through hole 113 is prevented and the lead wire 1343 and the bottom plate member 1110 are electrically insulated.

<A First Adhesive 117 and a Second Adhesive 118>

The first adhesive 117 is an optical setting adhesive of an acrylic system having an anaerobic property. The first adhesive 117 is loaded inside of the bush 116, a continuous space S including not only a first space S1 which is formed between the outer circumferential surface 1163 of the bush 116 and the inner circumferential surface 1131 of the housing through hole 113 but a second space S2 which seals the housing through hole 113, and a third space S3 which is formed between a lower surface of the flange portion 1162 and the upper surface of the bottom plate member 1110. The second adhesive 118 is an epoxy thermosetting adhesive, of which viscosity when it is not hardened is higher than that of the first adhesive 117. The second adhesive 118 is applied on the outer periphery of the flange portion 1162 so as to cover the vicinity of the outer peripheral part of the flange portion 1162 (the upper surface of the outer peripheral part, the outer peripheral surface, and the lower surface of the outer peripheral part) and the first adhesive 117 loaded into the third space S3. Thereby, in the first adhesive 117, the second space S2 and the third space S3 are covered with the second adhesive 118.

According to the present embodiment, for example, as the first adhesive 117, 3061J manufactured by Three Bond Corp. and as the second adhesive 118, 353ND manufactured by Epoxy Technology Corp. is used. As compared to the second adhesive 118, the viscosity of the first adhesive 117 when it is not hardened is lower and further, the hardness thereof after it is hardened is also lower. Paying attention to a Young's modulus of a degree of hardness when it is hardened, that of the first adhesive 117 is about 7 Mpa (Mega Pascal) and the second adhesive 118 is about 3.5 Gpa. In the meantime, the Young's modulus of the bottom plate part 1111 is 70.3 Gpa. In addition, as compared to the first adhesive 117, a coefficient of thermal expansion of the second adhesive 118 is lower when it is hardened.

<Sealing of the Housing Through Hole 113>

Figure 3:
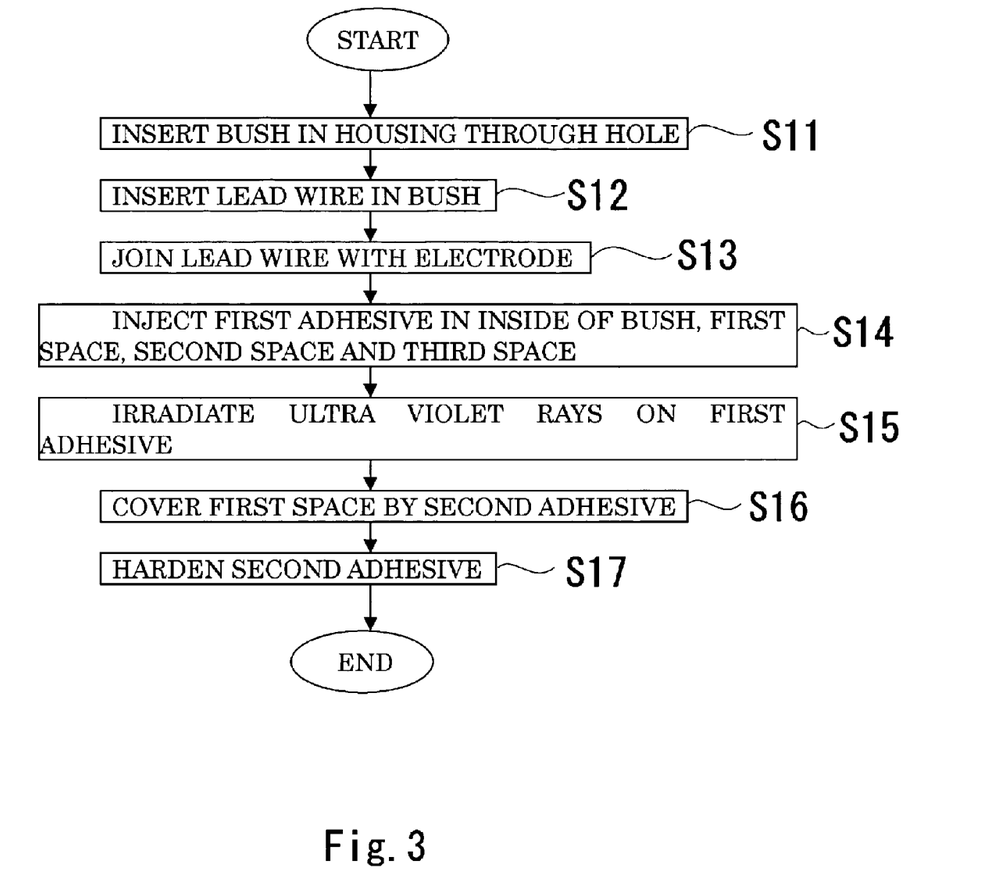
FIG. 3 is a view showing a flow of sealing of the housing through hole.

FIG. 3 is a view showing a flow of sealing of the housing through hole 113 formed on the bottom plate member 1110. Sealing of the housing through hole 113 is carried out before the second housing member 112 shown in FIG. 1 is joined with the first housing member 111 and the closed space 110 is formed.

At first, the cylindrical part 1161 of the bush 116 is inserted from the closed space of the bottom plate member 1110 into the housing through hole 113 and the flange portion 1162 abuts against the upper surface of the bottom plate member 1110 while covering the edge 1132 of the housing through hole 113 (step S11). However, in practice, a minute gap is put between the flange portion 1162 and the bottom plate member 1110. Subsequently, the lead wire 1343 is inserted in the inside of the bush 116 (step S12), and then, the lead wire 1343 is pulled out from the FPC opening of the FPC 114 to the open space 109 of the bottom plate member 1110 to be joined with the electrode by soldering (step S13). In the meantime, the lead wire 1343 may be inserted in the bush 116 before the bush 116 is inserted in the housing through hole 113. In this case, the bush 116 having the lead wire 1343 inserted therein in advance is inserted in the housing through hole 113.

If the bush 116 is inserted in the housing through hole 113 and the lead wire 1343 is inserted in the bush 116, the first adhesive 117 is injected from the open space 109 of the housing through hole 113 to be loaded inside of the bush 116, the first space S1, the second space S2, and the third space S3 so as to seal the housing through hole 113 (step S14). Then, irradiating ultraviolet rays from the closed space 110 and/or the open space 109 of the housing through hole 113 to the first adhesive 117, the first adhesive 117 is hardened (step S15).

When the irradiation of the ultraviolet rays to the first adhesive 117 has been completed, at the flange portion 1162 of the bush 116, the second adhesive 118 is applied at the outer peripheral part of the flange portion 1162. Thereby, the vicinity of the outer peripheral part of the flange portion 1162 (the upper surface of the outer peripheral part, the outer peripheral surface, and the lower surface of the outer peripheral part) and the first adhesive 117 loaded into the third space S3 are covered with the second adhesive 118 (step S16). In addition, in the first adhesive 117 loaded into the first space S1 is covered with the second adhesive 118. After that, by mounting the second adhesive 118 in a oven of 90° C. for one hour, the second adhesive 118 is hardened and sealing of the housing through hole 113 has been completed (step S17).

<A Comparative Example>

Figure 4:
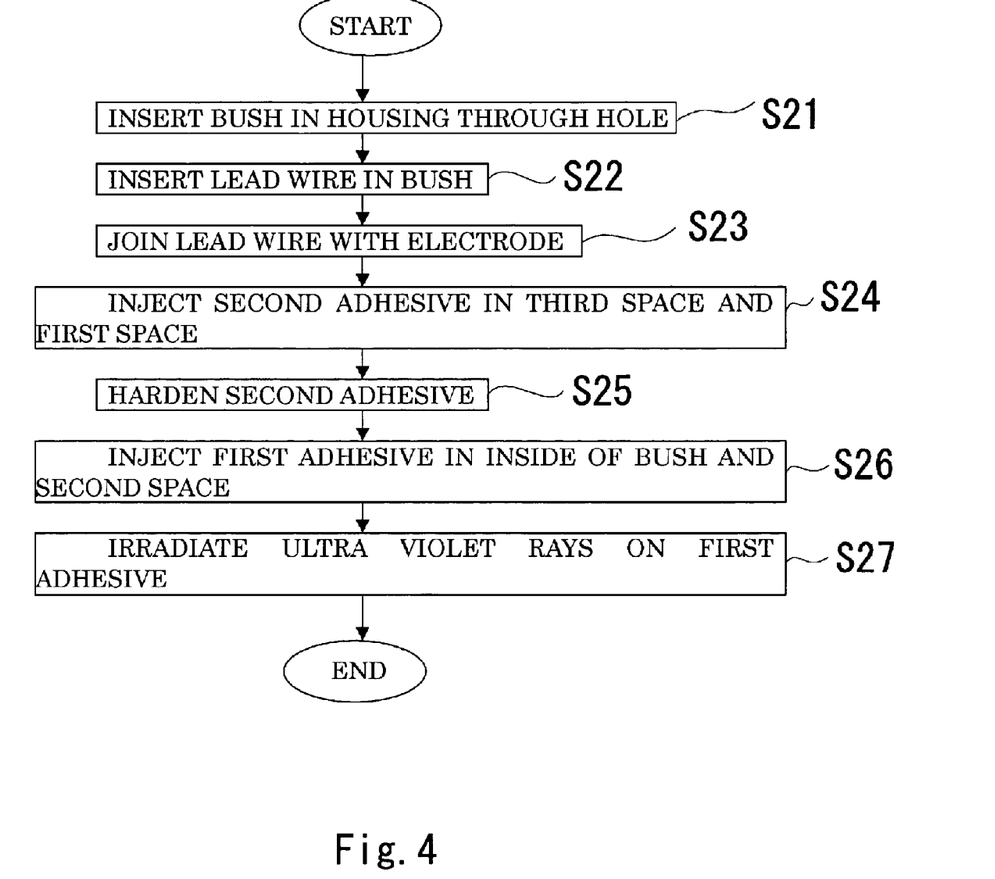
FIG. 4 is a view showing a flow of sealing of the housing through hole by a sealing method of a comparative example.

In the next place, as an example compared to the above-described method of sealing the housing through hole 113, a sealing method to inject the first adhesive after injecting the second adhesive having a higher viscosity than the first adhesive in the housing through hole 113 will be described below. FIG. 4 is a view showing a flow of sealing of the housing through hole according to the comparative example and FIG. 5 is a sectional view showing a vicinity of a housing through hole 913 that is sealed by the sealing method of the comparative example.

Figure 5:
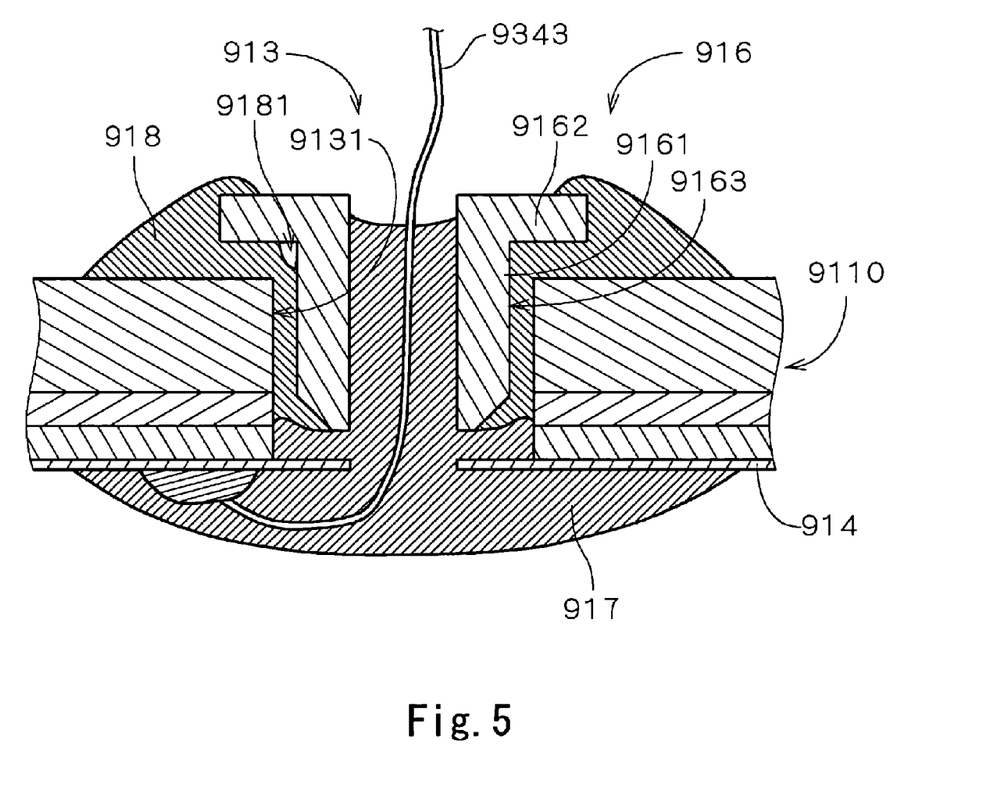
FIG. 5 is a sectional view enlarging a vicinity of a housing through hole of the comparative example.

According to the sealing method of the comparative example, at first, a cylindrical part 9161 of a bush 916 shown in FIG. 5 is inserted in a housing through hole 913 (step S21) and a lead wire 9343 is inserted in the inside of the bush 916 to be joined with an FPC 914 by soldering (steps S22 and S23). Subsequently, at a flange portion 9162 of the bush 916, a second adhesive 918 is applied at the outer peripheral side of the flange portion 9162 to cover the vicinity of the outer peripheral side of the flange portion 9162 (the upper surface of the outer peripheral part, the outer peripheral surface, and the lower surface of the outer peripheral part). Then, the second adhesive 918 (353ND manufactured by Epoxy Technology Corp.) is injected a third space S3 and a first space S1 (step S24). Then, in a oven, the second adhesive 918 is hardened (step S25). When the second adhesive 918 is completely hardened, a first adhesive 917 (3061J manufactured by Three Bond Corp.) is injected in the inside of the bush 916 and a second space S2 from the open space 109 of the bottom plate member 9110 (step S26). Then, hardening the first adhesive 917 by radiating ultra violet rays thereto, sealing of the housing through hole 913 has been completed (step S27).

As described above, according to the sealing method of the comparative example, the second adhesive 918 having a higher viscosity than the first adhesive 917 is injected into the third space S3 and the first space S1. Therefore, a gap 9181 without the second adhesive 918 may be formed into the third space S3 and/or the first space S1 which are a minute gaps. Particularly, since the viscosity of the second adhesive 918 is rapidly lowered when it is hardened, the second adhesive 918 moves to a narrower part in the third space S3 and/or the first space S1 by a capillary action so that a gap 9181 shown in FIG. 5 is formed at a relatively broad part. Then, in the endurance test such as a heating and humidification test and a heat shock test, it is feared that cracks occur from the gap 9181 to the second adhesive 918.

Against this, according to the sealing method of the present embodiment, as shown in FIG. 2, the first adhesive 117 having a lower viscosity than the second adhesive 118 is injected into the third space S3 and the first space S1. The first adhesive 117 having a lower viscosity is easily injected in the third space S3 and the first space S1 by a capillary action. As a result, in the motor unit 10 (namely, the motor 14 and the first housing member 111), it is possible to certainly seal the first space S1, the second space S2 and the third space S3 can be certainly sealed.

In addition, according to the sealing method of the comparative example, in the oven, the second adhesive 918 is hardened with the bush 916 shown in FIG. 5 thermal-expanded by a high temperature, and then, injecting the first adhesive 917 in the bush 916 to be hardened. The second adhesive 918 has a high degree of hardness when it is hardened. Therefore, when a peripheral temperature becomes low in the heat shock test or the like, it is feared that the second adhesive 918 hardened into the first space S1 and the third space S3 cannot follow increase of a distance between the bush 916 and the bottom plate member 9110 due to a difference of a coefficient of thermal expansion and the second adhesive 918 is separated from the bush 916 or the bottom plate member 9110.

On the contrary, the first adhesive 117 sealing the first space S1, the second space S2 and the third space S3 shown in 2 has a lower degree of hardness when it is hardened. Therefore, the first adhesive 117 can easily follow change of a distance between the bush 116 and the bottom plate member 1110 due to a difference of the coefficient of thermal expansion so as to prevent the first adhesive 117 from being separated from the bush 116 or the bottom plate member 1110. In addition, the first adhesive 117 can easily follow change of the inner diameter of the bush 116. As a result, in the motor unit 10, even if the peripheral temperature is largely changed in the heat shock test or the like, it is possible to certainly keep sealing of the housing through hole 113.

Thus, the motor unit 10 has a high decay durability against an environment that the peripheral temperature is largely changed in sealing of the housing through hole 113 formed in the bottom plate member 1110. Therefore, it is preferable that the motor unit 10 is utilized by the recording disk drive 1 to be mounted in the car, and particularly, the recording disk drive 1 is suitable for the hard disk drive such as a car navigation system or the like, in which the closed space 110 of the housing 11 is certainly separated.

In the sealing method of the comparative example, since the second adhesive 918 shown in FIG. 5 is injected in first, it is feared that minute amount of the second adhesive 918 is injected in the inside of the bush 916 in which the first adhesive 917 is not injected, along the inner circumferential surface of the bush 916. In this case, a thin layer of the second adhesive 918 formed along the inner circumferential surface of the bush 916 is bonded with the first adhesive 917. Generally, the strength of bonding the adhesives each other is not so high, so that the first adhesive 917 and the second adhesive 918 in the inside of the bush 916 may be separated each other. On the contrary, according to the sealing method of the present embodiment, since the first adhesive 117 shown in FIG. 2 is injected in first, the layer of the second adhesive 118 along the inner circumferential surface of the bush 116 is not formed, so that it is possible to prevent cracks from being generated at the first adhesive 117 in the inside of the bush 116.

In the recording disk drive 1, since the first adhesive 117 injected between the bush 116 and the bottom plate member 1110 is an optical setting adhesive, the first adhesive 117 can easily harden the part capable of lighted by ultra violet lays due to the optical setting property. In addition, when the first adhesive 117 has an anaerobic property and the first adhesive 117 is separated from air as being covered with the second adhesive 118 at the closed space 110 (refer to FIG. 1), it is possible to enhance hardening of a part that is difficult to light with ultra violet rays (for example, the part in the vicinity of the edge 1132 of the through hole 113).

The second adhesive 118 when it is hardened has a lower degree of thermal expansion than the first adhesive 117 when it is hardened and the bush 116 made of resin, so that by covering the vicinity of the outer periphery part of the flange portion 1162 with the second adhesive 118, it is possible to suppress lift of the bush 116 due to thermal expansion of the first adhesive 117 and the bush 116 from the closed space 110. As a result, the bush 116 can be certainly fixed to a certain position in the housing through hole 113.

In the recording disk drive 1, when the flange portion 1162 covering the edge 1132 of the housing through hole 113 abuts against the upper surface of the bottom plate member 1110, it is possible to easily position the bush 116 with respect to the housing through hole 113. In addition, the bush 116 can be easily attached to the bottom plate member 1110. In addition, when the first adhesive 117 is injected into the housing through hole 113 from the open space 109, it is possible to easily load the first adhesive 117 into the first space S1. Further, a labyrinth configuration is formed between the flange portion 1162 and the bottom plate member 1110, so that it is possible to more certainly seal the first space S1.

A Second Embodiment

Figure 6:
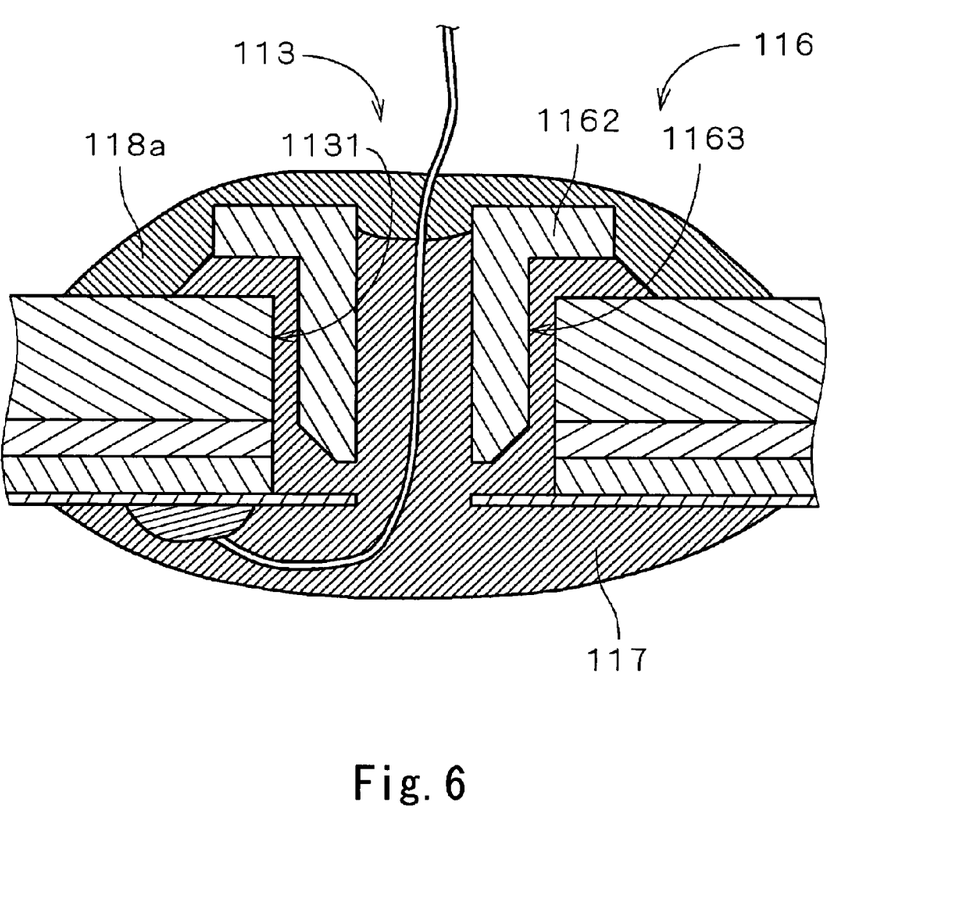
FIG. 6 is a sectional view enlarging a vicinity of a housing through hole according to a second embodiment.

FIG. 6 is a sectional view enlarging a vicinity of a housing through hole 113 that is sealed according to a sealing method of the second embodiment of the present invention. According to the example shown in FIG. 6, a second adhesive 118a is applied to the flange portion 1162 of the bush 116 so as to entirely cover the flange portion 1162. In addition to the first adhesive 117 loaded into the first space S1, the first adhesive 117 loaded in the inside of the bush 116 is also covered with a second adhesive 118a. Thus, at the flange portion 1162 of the bush 116, the first adhesive 117 is completely covered with the second adhesive 118a so as to further enhance hardening of the first adhesive 117 due to the anaerobic property. In addition, the operation to entirely apply the second adhesive 118a to the flange portion 1162 is easier than the operation to apply the second adhesive 118a to the outer periphery of the flange portion 1162, so that it is possible to improve an operational efficiency and a productivity.

As described above, the embodiments according to the present invention are described, however, the present invention is not limited to the above-described embodiments and various modifications are available.

For example, the first adhesive 117 and the second adhesive 118 are not limited to the acrylic and epoxy adhesives, respectively and they may be different kinds of adhesives. In addition, the first adhesive 117 may be the optical setting resin that is hardened by other kinds of light than ultra violet rays.

The lead wire to be inserted in the housing through hole 113 formed on the bottom plate member 1110 is not always limited to the lead wire from the latch coil 1342. For example, this lead wire may be a lead wire that is connected to other various configurations such as the lead wire of the windings from the stator 50 of the motor 14 and the lead wire of the windings from the voice coil 1332 of the head moving mechanism 133 or the like.

The first housing member 111 of the motor unit 10 according to each of the above-described embodiments may be a part of the housing 11 at least or it may be other part than the first housing member 111 (for example, a part of the second housing member 112 and the second housing member 112). In addition, the first housing member 111 may be formed on the housing 11 in an integrated manner.

The motor unit 10 may be utilized by other various recording disk drives such as a removable disk drive or the like other than the hard disk drive.

In addition, in the motor of the above-described respective embodiments, in place of the FPC, for example, a printed circuit board or the like can be attached and by using the PCB (Printed Circuit Board), the same effect as the present invention can be obtained.

What is claimed is:

1. A lead wire sealing device comprising:
a housing member that is a part of a housing which forms a closed space therein, the housing member having an upper surface facing the closed space of the housing and an lower surface facing an open space which is formed outside of the housing;
an electric component that is mounted on the upper surface of the housing member;
a lead wire connecting from the electric component to an electrode formed on the lower surface of the housing member for making an electrical connection with an outer device located in the open space of the housing;
a housing through hole that is formed in the housing member and penetrates from the closed space to the open space, the lead wire being inserted in the housing through hole;
a bush having a substantially tubular shape, the bush that is inserted into the housing through hole and covers an inner circumferential surface of the housing through hole, the lead wire being inserted in an inside of the bush;
a first adhesive that is filled into a continuous space including not only a first space which is formed between an outer circumferential surface of the bush and the inner circumferential surface of the housing through hole but a second space which seals the housing through hole, as a manner that the first adhesive has no isolated air bubble therein; and
a second adhesive having a higher viscosity than that of the first adhesive when they are not hardened, the second adhesive covering an upper space of the first space filled with the first adhesive to isolate the first adhesive from an inner air of the housing.

2. The lead wire sealing device according to claim 1, wherein the first adhesive is an acrylic adhesive.

3. The lead wire sealing device according to claim 2, wherein the first adhesive is an optical setting adhesive having anaerobic property.

4. The lead wire sealing device according to claim 1, wherein the second adhesive is an epoxy adhesive.

5. The lead wire sealing device according to claim 1, wherein the bush has a flange portion which is extended from an upper end portion of the bush to a radially outward direction; and
the first adhesive is loaded in the housing through hole from the open space.

6. The lead wire sealing device according to claim 5, wherein the second adhesive is loaded into the housing through hole from the closed space of the housing and the second adhesive is filled in a third space between a lower surface of the flange portion and the upper surface of the housing member and covers an outer peripheral surface of the flange portion.

7. The lead wire sealing device according to claim 5, wherein the second adhesive additionally covers the entire flange portion and the inside of the bush.

8. The lead wire sealing device according to claim 1, wherein the electric component is a latch coil.

9. A recording disk drive comprising:
   a housing which forms a closed space therein and has a housing member at a lower side of the housing, the housing member having an upper surface facing the closed space of the housing and an lower surface facing an open space which is formed outside of the housing;
   an electric component that is mounted on the upper surface of the housing member;
   an electric motor including a stator and a rotor, wherein the stator is fixed to the upper surface of the housing member and the rotor has a rotor magnet which is opposed to the stator in radial direction;
   a lead wire connecting from the electric component to an electrode formed on the lower surface of the housing member for making an electrical connection with an outer device located in the open space;
   a housing through hole that is formed in the housing member and penetrates from the closed space to the open space, the lead wire being inserted in the housing through hole;
   a bush having a substantially tubular shape, the bush that is inserted into the housing through hole and covers an inner circumferential surface of the housing through hole, the lead wire being inserted in an inside of the bush;
   a first adhesive that is filled into a continuous space including not only a first space which is formed between an outer circumferential surface of the bush and the inner circumferential surface of the housing through hole but a second space which seals the housing through hole, as a manner that the first adhesive has no isolated air bubble therein; and
   a second adhesive having a higher viscosity than that of the first adhesive when they are not hardened, the second adhesive covering an upper space of the first space filled with the first adhesive to isolate the first adhesive from an inner air of the housing.

10. The recording disk drive according to claim 9, wherein the first adhesive is an acrylic adhesive.

11. The recording disk drive according to claim 10, wherein the first adhesive is an optical setting adhesive having anaerobic property.

12. The recording disk drive according to claim 9, wherein the second adhesive is an epoxy adhesive.

13. The recording disk drive according to claim 9, wherein the bush has a flange portion which is extended from an upper end portion of the bush to a radially outward direction; and
   the first adhesive is loaded in the housing through hole from the open space.

14. The recording disk drive according to claim 13, wherein the second adhesive is loaded into the housing through hole from the closed space of the housing and the second adhesive is filled into a third space which is formed between a lower surface of the flange portion and the upper surface of the housing and the second adhesive covers an outer peripheral surface of the flange portion.

15. The recording disk drive according to claim 13, wherein the second adhesive additionally covers the entire flange portion and the inside of the bush.

16. The recording disk drive according to claim 9, wherein the electric component is a latch coil.

17. A method of sealing a housing member that is a part of a housing which forms a closed space therein and includes an electric component housed therein, a lead wire connecting from the electric component to an electrode formed on an lower surface of the housing member in an open space, a bush having a substantially tubular shape and a bush through hole therein, and a housing through hole that is formed in the housing member; the method comprising the steps of:
   inserting the bush into the housing through hole for covering an inner circumferential surface of the housing through hole;
   inserting the lead wire into the bush through hole and the housing through hole from an upper side of the bush;
   connecting the lead wire fixedly on the electrode for making an electrical connection;
   loading a first adhesive for filling into a continuous space including not only a first space which is formed between an outer circumferential surface of the bush and an inner circumferential surface of the housing through hole but a second space which seals the housing through hole, as a manner that the first adhesive has no isolated air bubble therein; and
   loading a second adhesive for covering an upper space of the first space filled with the first adhesive to isolate the first adhesive from an inner air, wherein the second adhesive has a higher viscosity than that of the first adhesive when they are not hardened.

18. The method of sealing the housing member according to claim 17 wherein the first adhesive is an acrylic adhesive.

19. The method of sealing the housing member according to claim 18, wherein the first adhesive is an optical setting adhesive having anaerobic property.

20. The method of sealing the housing member according to claim 17, wherein the second adhesive is an epoxy adhesive.

21. The method of sealing the housing member according to claim 17, wherein the bush has a flange portion which is extended from an upper end portion of the bush to a radially outward direction; and
   in the step of loading the first adhesive to seal the housing through hole, wherein the first adhesive is loaded from the open space of the housing through hole.

22. The method of sealing the housing member according to claim 21, wherein the second adhesive is loaded into the housing through hole from the closed space of the housing and the second adhesive is filled in a third space between a lower surface of the flange portion and the upper surface of the housing member and covers an outer surface of the flange portion.

23. The method of sealing the housing member according to claim 21, wherein the second adhesive additionally covers the entire flange portion and the bush through hole of the bush.

* * * * *